(12) United States Patent
Watanabe

(10) Patent No.: US 8,546,696 B2
(45) Date of Patent: Oct. 1, 2013

(54) PRINTED CIRCUIT BOARD AND METHOD FOR MANUFACTURING THE SAME

(75) Inventor: Hirohito Watanabe, Yotsukaido (JP)

(73) Assignee: Fujikura Ltd., Tokyo (JP)

( * ) Notice: Subject to any disclaimer, the term of this patent is extended or adjusted under 35 U.S.C. 154(b) by 509 days.

(21) Appl. No.: 12/820,605

(22) Filed: Jun. 22, 2010

(65) Prior Publication Data
US 2010/0319972 A1 Dec. 23, 2010

(30) Foreign Application Priority Data

Jun. 23, 2009 (JP) ................................ 2009-148510

(51) Int. Cl.
*H05K 1/00* (2006.01)
*H05K 3/00* (2006.01)
*H01R 9/00* (2006.01)

(52) U.S. Cl.
USPC ............................. 174/254; 361/748; 29/842

(58) Field of Classification Search
USPC ............ 174/254; 361/748–751; 29/842–845
See application file for complete search history.

(56) References Cited

U.S. PATENT DOCUMENTS 7,324,352 B2 * 1/2008 Goodwin ...................... 361/803
2006/0157271 A1 * 7/2006 Miura et al. ................... 174/250

FOREIGN PATENT DOCUMENTS

| JP | 49-042456 | | 4/1974 |
| JP | 63-131161 | U | 8/1988 |
| JP | 02-065884 | U | 5/1990 |
| JP | 2923012 | B2 | 4/1992 |
| JP | 3248266 | B2 | 5/1994 |
| JP | 2003-101167 | A | 4/2003 |
| JP | 2006-128167 | A | 5/2006 |
| JP | 2007-311568 | A | 11/2007 |

OTHER PUBLICATIONS

Office Action issued by the Japanese Patent Office in Japanese Patent Application No. 2009-148510 dated Feb. 26, 2013.

* cited by examiner

*Primary Examiner* — Jeremy Norris
(74) *Attorney, Agent, or Firm* — Sughrue Mion, PLLC

(57) ABSTRACT

A printed circuit board having a connection terminal which includes: an insulating substrate including first and second surfaces, and an end surface along an outline normal to an insertion direction of the connection terminal; at least one lead wiring layer formed on the first surface of the insulating substrate; an insulating protection film covering the lead wiring layer; at least one lead terminal layer constituting an end portion of the lead wiring layer, the lead terminal layer being formed into a strip, and having an end surface along the outline; a reinforcement body adhered on the second surface of the insulating substrate at a backside position of the lead terminal layer; wherein a distance between an outer surface of the lead terminal layer and an outer surface of the reinforcement body on the outline side is smaller than a distance therebetween on the lead wiring layer side.

15 Claims, 8 Drawing Sheets

FIG. 6

| | SAMPLE 1 | SAMPLE 2 | SAMPLE 3 | SAMPLE 4 | SAMPLE 5 |
|---|---|---|---|---|---|
| ΔH=H1−H2 [μm] | 0 | 2 | 5 | 30 | 50 |
| RESULT | × | ○ | ○ | ○ | ○ |

PRINTED CIRCUIT BOARD AND METHOD FOR MANUFACTURING THE SAME

CROSS REFERENCE TO RELATED PATENT APPLICATION

This application claims priority from Japanese Patent Application No. 2009-148510 filed on Jun. 23, 2009, the entire contents of which are incorporated by reference herein.

BACKGROUND

1. Technical Field

The present invention relates to a printed circuit board and a method for manufacturing the same, and more particularly relates to a printed circuit board having a connection terminal which has a structure preferable to connect with a connector, and a method for manufacturing the same.

2. Description of the Related Art

Recently, demands for downsizing electronics are increasing, and the same demands are also increasing for a printed circuit board attached to the electronics. In general, a printed circuit board has a main body and a connection terminal. On the main body, a circuit layer is disposed for connections of various electronic parts. The connection terminal is engaged and connected with an external connector.

The printed circuit board has various types such as a Rigid Printed Circuit board (RPC), Flexible Printed Circuit board (FPC), RPC/FPC composite board, Flexible Flat Cable (FFC) or the like. Here, the FFC is a cable only for connection, which does not have the aforementioned circuit layer. However, the FFC can be regarded as a kind of the printed circuit board because it is composed of a tape-shaped or ribbon-shaped flexible insulating board and lead wiring layers printed parallel thereon.

On the other hand, the connector is an electronic part to connect the connection terminal of a printed circuit board with electronics, a trunk connection cord or the like. The connector has also been reduced in height (thickness) thereof along with downsizing of the electronics and printed circuit boards.

When the printed circuit board is used in an apparatus having a movable portion such as a hinge (e.g. a foldable cellular phone and the like), at lease a part of the printed circuit board corresponding to the movable portion is composed of the FPC or FFC. In this case, the printed circuit board likely has a connection terminal formed along one of the outlines of FPC or FFC for connection of a connector.

The connection terminal of printed circuit board is more likely to be thinner along with reduction of the height of the connector. In such circumstances, the connection terminal is required to maintain an adequate mechanical strength and shape even in many insertions into and removals from the connector to obtain a good electrical connection and secure engagement with a contact portion of a connector terminal in the connector.

Therefore, an example of a general structure of a conventional connection terminal provided in a printed circuit board will be described with reference to FIG. 1. This figure is a sectional view schematically showing a connector and a connection terminal of the printed circuit board connecting with the connector.

The connector C0 has a connector case Ca (depicted by two-dots chain lines) and a plurality of connector terminals C1 housed in the connector case Ca. The connector case Ca is made of, for example, plastic. The connector terminals C1 are arrayed in the case Ca with a parallel relationship. Each connector terminal C1 is made of conductive and elastic metal plate, and molded to have a U-shape with two arms. Each connector terminal C1 has a protruding contact portion C2 formed so as to protrude from at least one of inner surfaces of the two arms.

A connection terminal T is connected with a main body of a printed circuit board PC. The connection terminal T is formed into a rectangular plate, and has a flexible insulating board 51 integrally connecting with the main body and a plurality of lead wiring layers 53 provided on an upper surface of the flexible insulating board 51. The lead wiring layers 53 are formed by patterning a copper film adhered on the upper surface of the flexible insulating board 51 by a adhesive layer 52 provided therebetween. The patterned lead wiring layers 53 are arranged parallel to each other on the flexible insulating board 51.

A main body side of each lead wiring layer 53 is covered with a coverlay 55 adhered by an adhesive layer 54. A connector C0 side of each lead wiring layer 53 is exposed from the coverlay 55 so as to form a lead terminal layer 53a at the tip-end portion thereof.

In the connection terminal T, a reinforcement layer 57 is adhered on a lower surface of the insulating layer 51 by an adhesive layer 56 provided therebetween. End surfaces of the insulating layer 51, lead terminal layers 53a and reinforcement layer 57 are terminated so as to form a common end surface Te which forms one of outlines of the printed circuit board PC.

In the above conventional technique, the lead terminal layers 53a is likely to be peeled off from the insulating board 51 when the connection terminal T is inserted into and engaged with the connector C0. This is because an end surface of the lead terminal layer 53a, which is located on the common end surface Te, is formed so as to be normal to an insertion direction, thus the end surface is likely to butt an edge of an inner surface of the connector terminal C1 or a protruding portion of the terminal portion C2.

Accordingly, there are problems in that the contact portion C2 of the connector terminal C1 cannot properly engage with the upper surface of the lead terminal layer 53a to electrically connect therewith, and in that the adjacent terminal layers unexpectedly create a short circuit by bending peeled terminal layers 53a.

The engagement state between the connection terminal T and connector C0 is expected to be stable for a long time. However, since the connection terminal T may be inserted into and removed from the connector C0 in many times, the connection terminal T may be peeled off, making the connection between the connection terminal T and the connector C0 impossible.

A Japanese Patent No. 3248266 (patent document 1) discloses a technique to prevent peeling off of the connection terminal. This technique will be described with reference to FIG. 1. As seen in this figure, the connector case Ca has tapered inner surfaces Cat. The patent document 1 intends to solve a problem that the lead terminal layer 53a and insulating substrate 51 are peeled off by contact of ends of the lead terminal layers 53a with the inner surfaces Cat before the insertion of the connection terminal T into the connector C0 is completed.

As a solution for the above problem, a projection portion PX (indicated by dash lines) is provided at the ends of reinforcement body 57 and insulating substrate 51. This projection portion PX protrudes longer than the extension of the end surface of the lead terminal layer 53a toward the insertion direction. However, it is still impossible to solve the above problems resulting from the lead terminal layer 53a butting the edge of the inner surface of the connector terminal C1 or the protruding contact portion C2.

Meanwhile, the common end surface Te along the outline of the printed circuit board PC is formed by a conventional technique (see the Japanese Patent No. 2923012 (Patent Document 2)). In this technique, a printed circuit board base material having the same circuit patterns thereon is separated by cutting (punching) into each printed circuit board having the circuit and outlines to form the final shapes.

SUMMARY

The present invention provides a printed circuit board and manufacturing method thereof, the printed circuit board being preferable to prevent lead terminal layers of a connection terminal from being peeled off.

A first aspect of the present invention provides a printed circuit board having a connection terminal with an outline configured to be inserted into an external connector. The connection terminal has: an insulating substrate provided with a first surface and a second surface opposite to the first surface, the insulating substrate including an end surface along the outline normal to an insertion direction of the connection terminal to the external connector; at least one lead wiring layer formed on the first surface of the insulating substrate; an insulating protection film covering the lead wiring layer; at least one lead terminal layer forming an end portion of the lead wiring layer, the lead terminal layer being formed into a thin strip, and having an exposed outer surface and an end surface along the outline; and a reinforcement body adhered on the second surface of the insulating substrate at a backside position of the lead terminal layer, the reinforcement body having an outer surface; wherein a first distance between the outer surface of the lead terminal layer and the outer surface of the reinforcement body on the outline side is smaller than a second distance therebetween on the lead wiring layer side.

The at least one lead wiring layer and at least one lead terminal layer may include a plurality of lead wiring layers and a plurality of lead terminal layers, respectively, and the lead terminal layers may be arranged parallel with each other.

The printed circuit board may further include an adhesive layer adhering the reinforcement body to the insulating substrate, wherein a thickness of the adhesive layer on the outline side is smaller than that thereof on the leading wiring layer side, thereby defining a relationship in that the first distance is smaller than the second distance.

The printed circuit board may further include: a first circuit layer provided on the first surface of the insulating substrate, the first circuit layer electrically connecting with the lead terminal layer through the lead wiring layer; and a second circuit layer provided on the second surface of the insulating substrate, the second circuit layer being formed so as to avoid the backside position of the lead terminal layer.

The second circuit layer may have an edge parallel to the outline and spaced apart from the outline toward the lead wiring layer side to form a step on the second surface of the insulating substrate, thereby defining a relationship in that the first distance is smaller than the second distance.

A difference of the second distance from the first distance may be 2 µm or more.

The lead terminal layer may have an inclined surface at an end portion thereof, the inclined surface being inclined toward the insulating substrate.

The adhesive layer may be made of thermosetting resin adhesive.

A second aspect of the present invention is a method for manufacturing a printed circuit board having a connection terminal being configured to be inserted into an external connector, the connection terminal having an outline normal to an insertion direction of the connection terminal. The method including: (a) forming at least one lead terminal layer into a thin strip on a first surface of an insulating substrate, the at least one lead terminal having an end surface along the outline and an upper outer surface exposed to the outside; and the insulating substrate having an end surface along the outline; (b) adhering a first adhesive layer and a second adhesive layer being thicker than the first adhesive layer on a first surface of a reinforcement body, the first adhesive layers being disposed on the outline side, and the second adhesive layers being disposed on an opposite side to the outline side; (c) facing the first and second adhesive layers to a second surface of the insulating substrate at a backside position of the lead terminal layer, the second surface being opposite to the first surface of the insulating substrate; and (d) thereafter, hot-pressing the first surface of the lead terminal layer and a second surface opposite to the first surface of the reinforcement body toward each other to adhere on a second surface of the insulating substrate being opposite to the first surface thereof.

In the printed circuit board according to the above exemplary embodiment, the lead terminal layer and the reinforcement body face to each other so that a distance between the outer surfaces thereof is smaller on the outline side than on the lead wiring layer side. Accordingly, in an early insertion state of the connection terminal into the connector, it is possible to prevent an end surface or an edge of the lead terminal layer from contacting with the edge of the inner surface of the connector terminal or the protruding portion of the terminal portion. While the connection terminal is further inserted, the tip-end of the contact portion pushes the lead terminal, and the connection terminal smoothly slides along the inclined surface. Accordingly, the connection terminal can engage with the connector so that the outer surface of the lead terminal layer correctly positions.

The aforementioned insertion manner can prevent the lead terminal layer from being peeled off. Therefore, even if the connection terminal is repeatedly inserted into and removed from the connector many times, the shape of the lead terminal layer can be maintained for a long time, creation of a short circuit between the lead terminal layers can be prevented, and good engagement and connection state between the connection terminal and the connector can be stably secured.

In addition, according to the method for manufacturing a printed circuit board, the process (b) can simply and easily make a distance between the outer surface of the lead terminal layer and the outer surface of the reinforcement body on the outline side smaller than a distance therebetween on the lead wiring layer side.

BRIEF DESCRIPTION OF THE DRAWINGS

FIG. 6 shows results of a peeling resistance test for lead terminal layers of printed circuit boards according to the first exemplary embodiment of the present invention, the test investigating peeling resistances of the lead terminal layers with different inclined angles.

DETAILED DESCRIPTION

Figure 1:
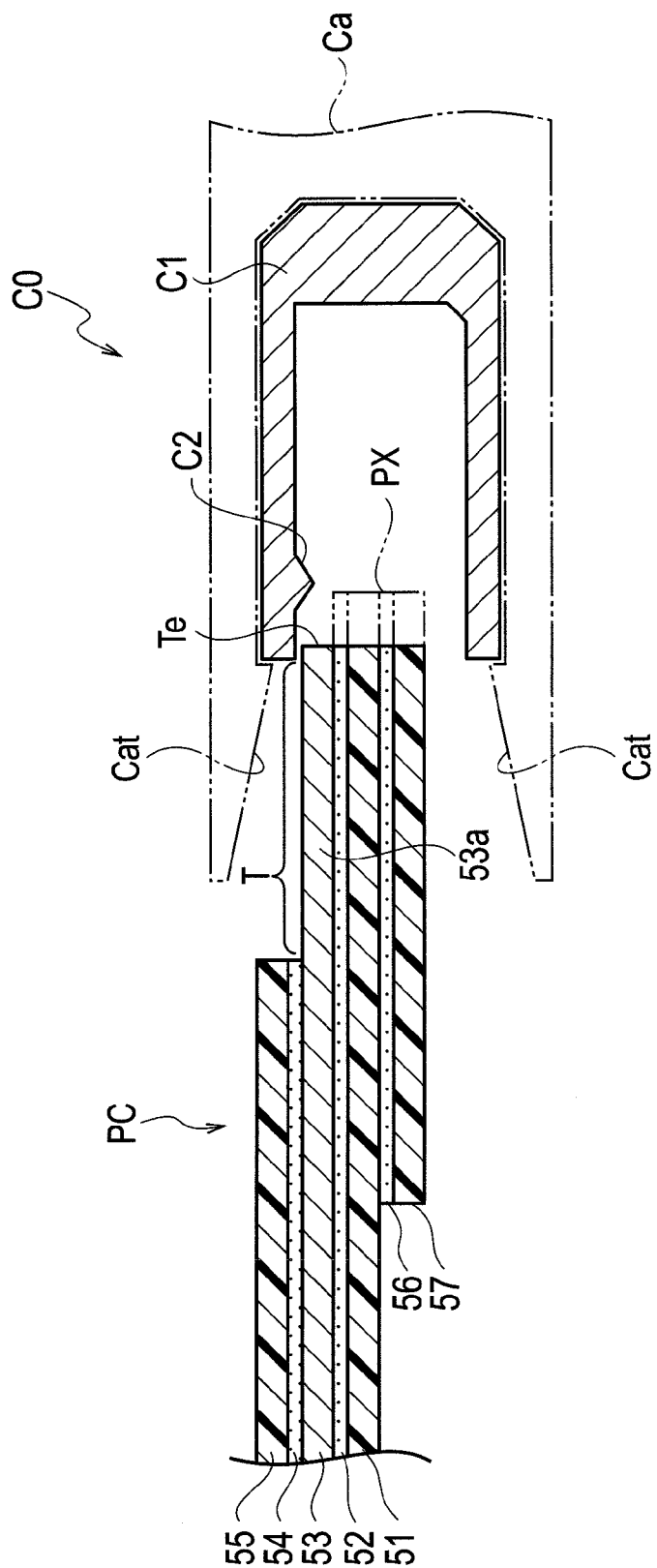
FIG. 1 is a sectional view showing a connection terminal in a conventional printed circuit board.

Hereinafter, printed circuit boards according to first through third exemplary embodiments will be explained with reference to FIGS. 2 to 8. It should be noted that same parts are indicated by the same reference numerals through figures. Therefore, when the parts are once explained with a figure, the explanations about them with the other figures are omitted for the sake of simplicity.

First Embodiment

FIGS. 2 to 5 show mainly a connection terminal in a printed circuit board according to the first exemplary embodiment. A structure of the connection terminal will be explained with FIGS. 2 (a cutaway view), 3A and 3B (sectional views). FIGS. 3A and 3B show a difference in that the connection terminal is bent or not bent around a base portion thereof.

The printed circuit board PC has: a main body in which a circuit layer (not shown) electrically connects between various electronic parts mounted thereon; and a connection terminal T1 which is inserted into and engaged with an external connector C0 for electrical connection.

The connector C0 has a connector case (see "Ca" in FIG. 1) and connector terminals C1 accommodated in the connector case. The connector case is made of resin, for example. The connector terminals C1 are disposed in parallel with each other. Each connector terminal C1 is made of conductive and elastic metal plate, and has a U-shape with two arms, for example. Each connector terminal C1 has a contact portion C2 on at least one of inner surfaces of the two arms. The contact portion C2 is formed so as to protrude from the inner surface, and positions at the tip-end side of the arm. The connection terminal T1 has an appropriate length (a terminal length) to a depth of the U-shaped connector terminal C1, and it engages and connects with the inner surface of the connector terminal C1 and the contact portion C2.

The connection terminal T1 has an insulating substrate 1 and lead terminal layers 2 formed on a first surface (upper surface in FIG. 3A) of the insulating substrate 1. The insulating substrate 1 has an end surface 1a along an outline Y of the printed circuit board PC. The outline Y is normal to an insertion direction (indicated by an arrow X) of the connection terminal T1 to the connector C0. The lead terminal layers 2 are formed as end portions of the lead wiring layers 4 electrically connecting with the circuit layer (not shown). In other words, the lead terminal layers 2 formed as an extended pattern of the lead wiring layers 4. The lead terminal layers 2 are disposed in parallel to each other, and have end surfaces 2a along the outline Y. These terminal layers 2 and lead wiring layers 4 are adhered on the upper surface of the insulating substrate 1 by an adhesive layer 3.

On the lead wiring layers 4 and circuit layer, an insulating protection film 6 is adhered by an adhesive layer 5. The insulating protection film 6 is disposed so as to expose upper surfaces of the lead terminal layers 2 with the appropriate length (terminal length) to the depth of the U-shaped connector terminal C1. An edge 6a of the insulating protection film 6 extends parallel to the outline Y, and is located apart from the end surfaces 2a of the lead terminal layers 2 by the terminal length. Therefore, the edge 6a functions as a border between base portions of the lead terminal layers 2 and the lead wiring layers 4.

Each lead terminal layer 2 is a thin and rectangular strip having a flat outer surface 2s (hereinafter, simply referred as a surface 2s) which engages with the contact portion C2 of each connector terminal C1. The lead terminal layers 2 are disposed so that the lengthwise direction thereof is normal to the outline Y. The lead terminal layers 2 are disposed in parallel with each other at a predetermined distance (i.e. pitch). The upper surfaces of the lead terminal layers 2 are plated by solder or the like, or highly conductive metal such as nickel, gold or the like in order to avoid corrosion and to reduce contact resistance between the lead terminal layers 2 and the connector terminal C1. Specifically, plated layers made of the above material are formed on the whole of these upper surfaces.

A reinforcement body 7 is adhered on a second surface (lower surface in FIG. 3A) of the insulating substrate 1 by an adhesive layer 8. The reinforcement body 7 reinforces the mechanical strengths of whole arrayed lead terminal layers 2 from the backside thereof.

As same as the end surface 1a of the insulating substrate 1 and the end surfaces 2a of the lead terminal layers 2, the reinforcement body 7 has an end surface 7a along the outline Y. A part of the reinforcement body 7 is provided over the base portions of the lead terminal layers 2 so as to overlap the insulating protection film 6. Therefore, an end surface 7b, which is an opposite end surface to the end surface 7a, is located under the insulating protection film 6. The position of the end surface 7b is set depending on the required reinforcement force for the lead terminal layers 2.

The reinforcement body 7 is formed into a plate-like shape, and has a flat outer surface 7s (hereinafter, simply referred as a surface 7s) at a side (a lower side in FIG. 3A) opposite to a side at which the insulating substrate 1 is disposed. In this embodiment, the reinforcement body 7 has a uniform thickness as a whole, and is formed by a reinforcement film made of insulating material such as polyimide resin, glass epoxy resin or the like.

Next, an explanation will be made about distances H1 and H2 between the surface 2s of each lead terminal layer 2 and the surface 7s of the reinforcement body 7 in the thickness directions thereof, wherein the surfaces 2s and 7s face to each other and sandwich the insulating substrate 1.

The distance H1 between the two surfaces 2s and 7s at a position where the edge 6a of the insulating protection film 6 is located has the maximum value, and it corresponds to the maximum thickness of the connection terminal T1. The distance H2 between the two surfaces 2s and 7s at a position where the end surfaces 2a of the lead terminal layers 2 are located has a minimum value, and it corresponds to the minimum thickness of the connection terminal T1.

There are various connectors such as a fixed-type connector having connector terminals each having two arms whose gap is constant, and an open-close-type connector having connector terminals each having two arms whose gap is manually variable. In the present exemplary embodiment, as an example, the fixed-type connector is used as the connector C1.

Here, a gap D1 is defined as a distance between the tip-end of the contact portion C2 in one arm of the two arms (upper arm in FIG. 3A) and the inner surface of the other arm of the two arms (lower arm in FIG. 3A) before engagement between the connection terminal T1 and the connector C0. The gap D1 is set to a value fulfilling a relationship H1>D1>H2 in order to obtain an elastic engagement with an appropriate pressure. In this case, the position of the tip-end of the contact portion C2 varies depending on the insertion depth of the connection terminal T1 to the connector terminal C1. Specifically, a variation amount of the gap D1 is set within a range of a distance difference ΔH between two distances H1 and H2.

As described above, the lead terminal layers 2 and the reinforcement body 7 face to each other so that the distance between the surfaces 2s and 7s is smaller on the outline Y side than on the lead wiring layer 4 side. Specifically, the surfaces 2s and 7s are mutually inclined so that the connection terminal T1 becomes thinner at the end thereof. In addition, the distance H2 and the gap D1 are set so as to prevent the end surface 2a of each lead terminal layer 2 from unexpectedly butting into the tip-end of the contact portion C2 while engagement therebetween, and also set so as to obtain an engaging pressure of the contact portion C2 to each lead wiring layer 2, as large as possible, and thus the surfaces 2s and 7s are mutually inclined.

In order to obtain the distances H1 and H2 as described above, the adhesive layer 8 for the reinforcement body 7 is formed so that a thickness thereof becomes smaller on the outline Y side than on the lead wiring layer 4 side. Alternatively, the adhesive layer may has a constant thickness and the reinforcement layer 7 may be formed so that a thickness thereof is smaller on the outline Y side than on the lead wiring layer 4 side. In this regards, it is more advantageous to change the thickness of the adhesive layer 8 as described later.

Figure 3A:
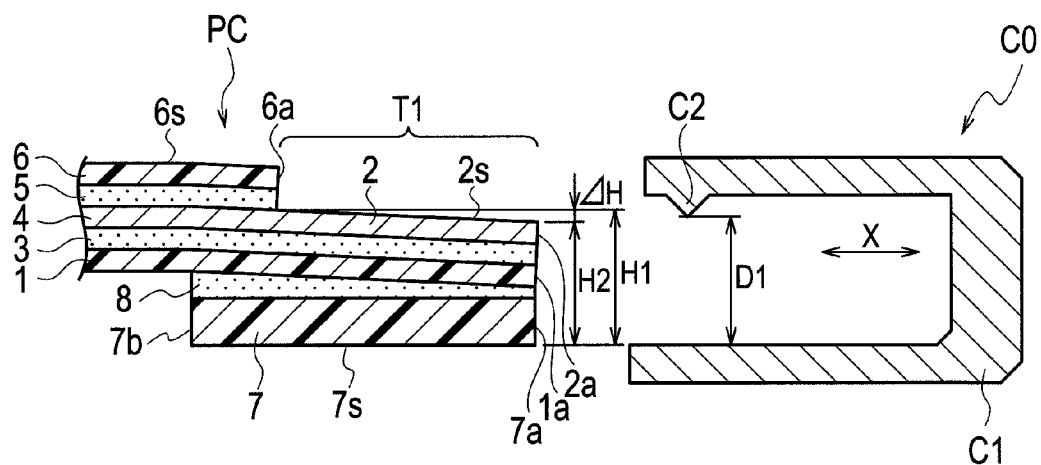
FIG. 3A is a sectional view along A-A line as seen toward a direction indicated by arrows, and it shows a state where a printed circuit board is bent around a base portion of the connection terminal.
Figure 3B:
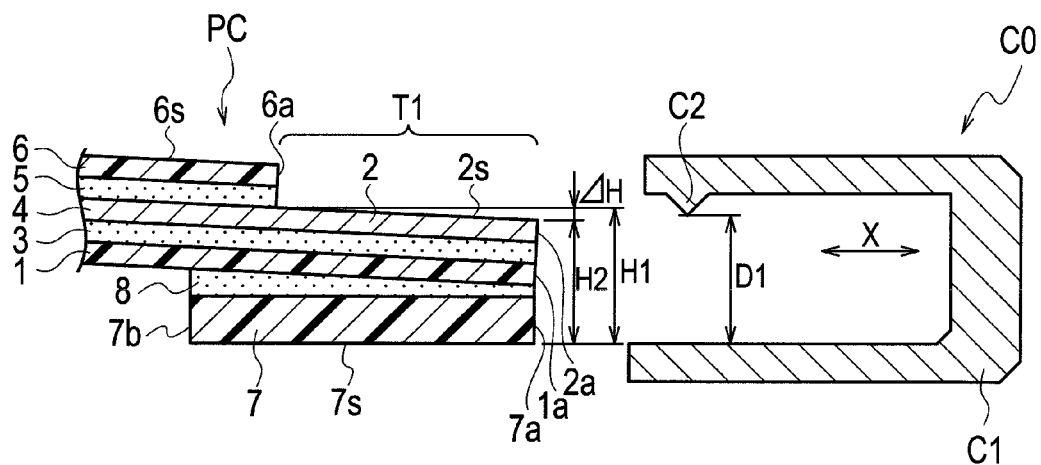
FIG. 3B is a sectional view along A-A line as seen toward a direction indicated by arrows, and it shows a state where a printed circuit board is not bent.

The printed circuit board PC as shown in FIG. 3A is bent or curved around a position where the lead wiring layer 4 connects with the base portion of the connection terminal T1 so that an outer flat surface 6s of the insulating protection film 6 become parallel to the surface 7s of the reinforcement body 7. This bending or curving is made by heating and pressurizing (i.e. hot-press), for example. On the other hand, the printed circuit board PC as shown in FIG. 3B is neither bent nor curved. Instead, the reinforcement body 7 is adhered on the plane-shaped end portion of the printed circuit board PC in an inclined manner. Whether or not bending or curving the printed circuit board PC can be arbitrarily selected depends on the insertion operability and shape of the connector case when the connection terminal T1 is inserted into the connector C0 with placing the surface 7s of the reinforcement body 7 parallel to the lower inner surface of the connector terminal C1.

Next, an explanation will be made about exemplary materials and dimensions of members constituting the connection terminal T1. The lead wiring layer 4, lead terminal layers 2 and circuit layer (not shown) are formed by patterning a single-sided copper-clad substrate (single-sided Copper-Clad Laminate; single-sided CCL). The single-sided copper-clad substrate has an insulating substrate 1 (e.g. 25 μm thick) and a copper film (e.g. 35 μm thick) adhered on one surface of the insulating substrate 1. The insulating substrate 1 is flexible and is made of a polyimide resin film. In this case, an epoxide-based thermosetting resin adhesive having a thickness (e.g. 10 μm thick) is used as the adhesive layer 3. Note, liquid polymer may be also used as a material of the flexible insulating substrate 1.

The insulating protection film 6 is formed by a coverlay made of polyimide resin film (e.g. 25 μm thick). The reinforcement body 7 is formed into a film or plate (e.g. 125 μm thick), and is made of polyimide resin. The adhesive layer 5 is 35 μm thick. The adhesive layer 8 is 50 μm thick on the distance H1 (i.e. the maximum distance) side and (50-ΔH)μm thick on the distance H2 side. Both adhesive layers 5 and 8 are made of epoxide-based thermosetting resin adhesive.

According to the above dimensions, the maximum thickness of the connection terminal T1 is about 245 μm, which is equal to the maximum distance H1 between the surfaces (flat outer surfaces) 2s of the lead terminal layers 2 and the surface (flat outer surface) 7s of the reinforcement body 7. In addition, when the distance (thickness) difference ΔH is set to 50 μm, the minimum thickness of the connection terminal T1 on the distance H2 side can be set to about 195 μm, which is equal to the minimum distance H2, by setting the thickness of the adhesive layer 8 on the same side to substantially zero.

Meanwhile, the number of lead terminal layers 2 (i.e. the number of terminals) is arbitrarily set depending on the specifications of the connectors that have various numbers of connector pins (e.g. 4 to 50 pins).

In the present exemplary embodiment, a length of each lead terminal layer 2 (terminal length) and the width thereof (terminal width) are 1.7 mm and 0.3 mm, respectively. A distance between the adjacent lead terminal layers (i.e. a pitch) is 0.5 mm. The lead terminal layers 2 can forms various patterns such as parallel stripes, zigzag stripes or the like. A width of each lead wiring layer 4 (lead width) is the same as that of the lead terminal layer 2, and a distance between the adjacent lead wiring layers 4 is the same as that between the adjacent lead terminal layers 2.

Figure 4A:
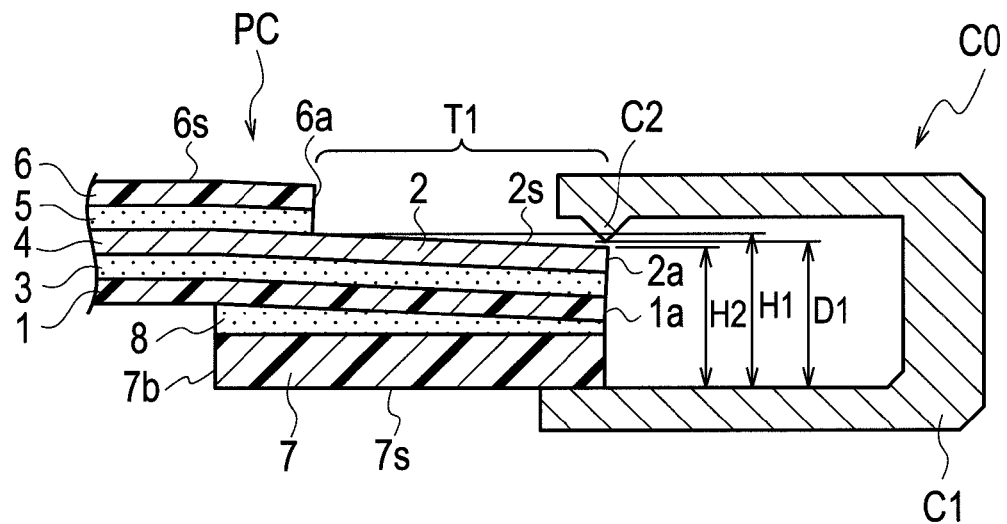
FIGS. 4A and 4B are sectional views respectively showing an engagement state between the connector terminal and the connection terminal of the printed circuit board according to the first exemplary embodiment.
Figure 4B:
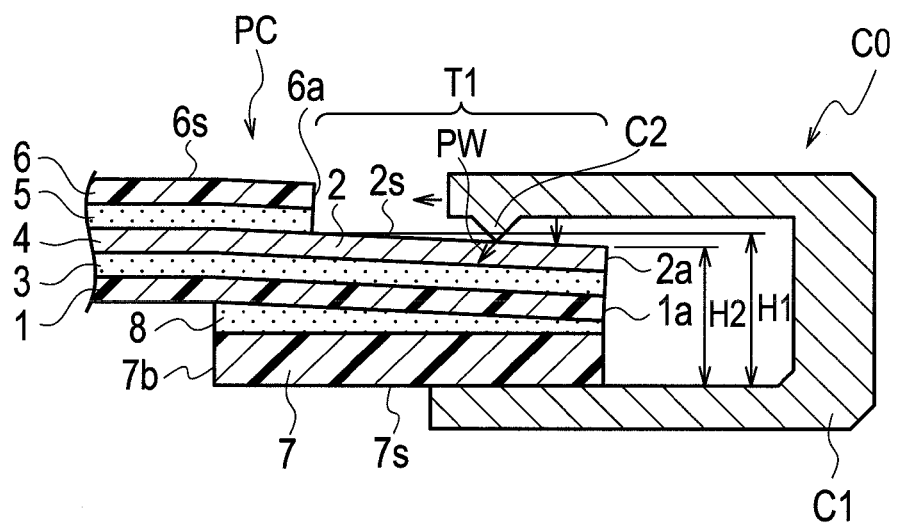

Next, an explanation will be made about engagement states in an insertion operation of the connection terminal T1 into the connector C1 with reference to FIGS. 4A and 4B. FIG. 4A shows an early insertion state where the end surface of the connection terminal T1 is inserted into the connector C1 slightly over the tip-end of the contact portion C2 of the connector terminal C1. FIG. 4B shows a state where the connection terminal T1 is further inserted while the tip-end of the contact portion C2 slidably contacts with the surface 2s of the lead terminal layer 2.

As shown in FIG. 4A, when the connection terminal T1 starts to be inserted into the connector terminal C1 with bringing the surface 7s of the reinforcement body 7 into contact with the lower inner surface of the connector terminal C1, the surface 2s of the lead terminal layer 2 is inclined so that the end part thereof is lower and the base part thereof is higher.

In the early insertion state as shown in FIG. 4A, the end surface 2a and the inclined surface 2s proceed into the connector terminal C1 without touching the edge of the connector terminal C1 and the tip-end of the contact portion C2. Therefore, a stress causing peel-off does not generate in the lead terminal layers 2.

In the state as shown in FIG. 4B, the tip-end of the contact portion C2 comes in contact with the surface 2s. Thereafter, the end portion of the connection terminal T1 proceeds to slidably move into the connector terminal C1 while the surface 2s is subjected to a total force in a direction indicated by an arrow PW, which results from the horizontal movement of the connector terminal C1 and an elastic force thereof.

The insertion and engagement of the connection terminal T1 proceeds to a state where the contact portion C2 pushes the surface 2s toward the insulating substrate 1. Accordingly, it is possible to prevent the end portion of the lead terminal layer 2 from being peeled off from the insulating substrate 1. Further, it is possible to avoid a short circuit between the adjacent lead terminal layers 2.

When the insertion of the connection terminal T1 is completed, the contact portion C2 properly positions at a position defined by the connector specification and maintains the electrical connection.

Next, an explanation will be made about a method for manufacturing a printed circuit board PC with reference to FIGS. 5A to 5C. The printed circuit board PC is manufactured by the following processes. Firstly, a wiring base material is prepared. The wiring base material is made of a single-sided Copper-Clad Laminate (single-sided CCL). On the wiring base material, same circuit patterns are formed. Using a punching die, the wiring base material is cut into shapes each having the circuit pattern and predetermined outlines. Here, a three-layered Copper-Clad Laminate (three-layered CCL) is used as the wiring base material. The three-layered CCL has a copper film, a base film (insulating substrate), and an adhesive layer between the copper film and the base film.

In the formation of each printed circuit board PC, the copper film is patterned to form the aforementioned circuit layer (not shown), the lead wiring layers 4 and the lead terminal layers 2 on an upper surface (first surface) of the insulating substrate 1 of the single-sided CCL, and the insulating protection film 6 is adhered on the lead wiring layers 4 by the adhesive layer 5.

Figure 5A:
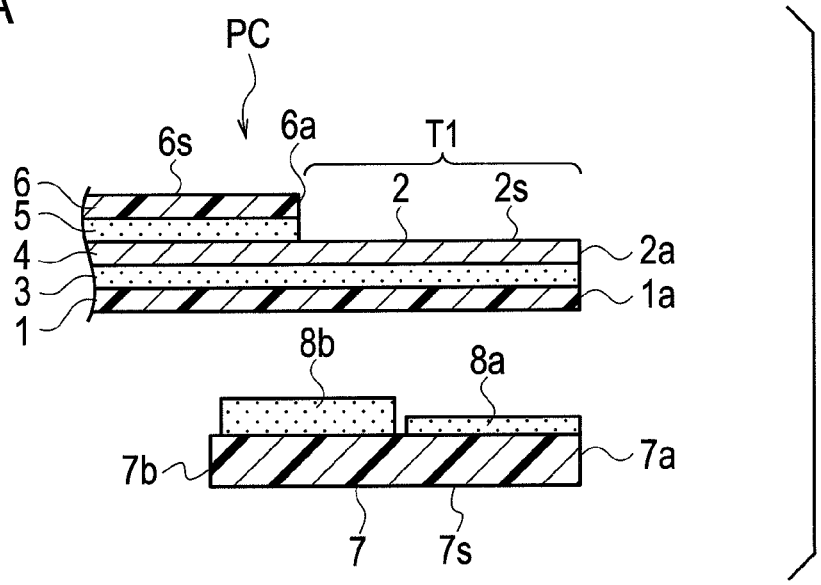
FIGS. 5A, 5B and 5C are sectional views showing steps of a manufacturing method according to the first exemplary embodiment of the present invention.

Thereafter, as shown in FIG. 5A, the edge 6a is formed in the insulating protection film 6 so as to be apart from the outline Y (see FIG. 2) of the end portion of the connection terminal T1, and the lead terminal layers 2 are formed on the upper surface of the insulating substrate 1 into thin and parallel strips. Each lead terminal layer 2 has the end surface 2a along the outline Y and the flat outer surface 2s which is an upper surface exposed from the insulating protection film 6.

The reinforcement body 7 having a following configuration is prepared in advance. On one surface (upper surface in FIG. 5A) of the reinforcement body 7, a first adhesive layer 8a and a second adhesive layer 8b are adhered. The first adhesive layer 8a is relatively thin, and is positioned on the outline Y side. The second adhesive layer 8b thicker than the first adhesive layer 8a is positioned on the side spaced apart from the outline Y side.

Figure 5B:
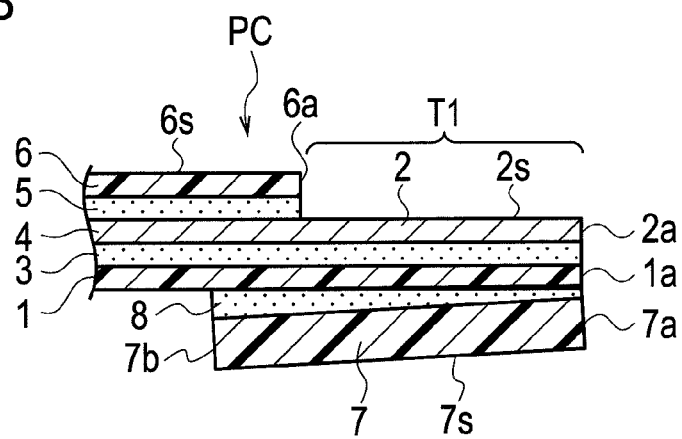

Next, as shown in FIG. 5B, the reinforcement body 7 is set so that the first adhesive layer 8a positions on the outline Y side, and the first and second adhesive layers 8a and 8b are faced to a lower surface (second surface) of the insulating substrate 1 at the backside position of the lead terminal layers 2. Thereafter, the reinforcement body 7 is adhered on the lower surface (second surface) of the insulating substrate 1 by hot-pressing the surfaces 2s of the lead terminal layers 2 and the outer surface 7s of the reinforcement body 7 toward each other. In this hot-press, a distance relationship H1>D1>H2 is simply and easily established because of the thickness difference between the first and second adhesive layers 8a and 8b. That is, the printed circuit board PC is simply and easily manufactured.

Figure 5C:
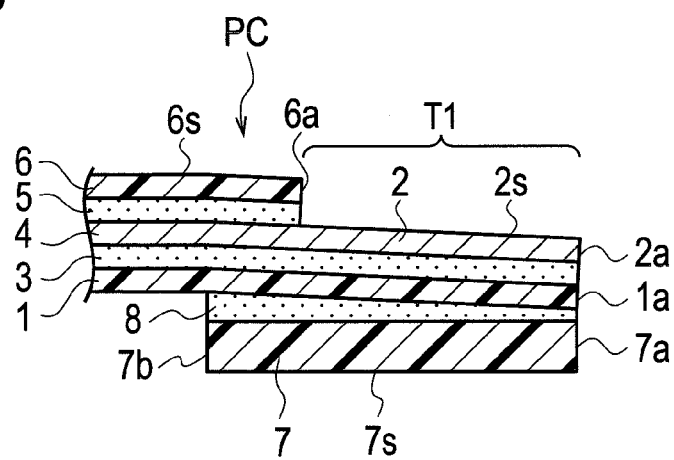

As shown in FIG. 5C, the printed circuit board PC may be bent or curved around a position where the lead wiring layer 4 connects with the base portion of the connection terminal T1 so that an outer flat surface 6s of the insulating protection film 6 becomes parallel to the outer flat surface 7s of the reinforcement body 7. This bending or curving is made by hot-press, for example.

Next, a peeling resistance test will be explained with reference to FIG. 6. In this test, peeling resistances of the lead terminal layers 2 was investigated in the various distance differences ΔH=H1−H2 [μm] each of which is the difference between the distances between the surfaces 2s and 7s at the base portion of the connection terminal T1 and at the end portion thereof.

[Samples]

In the peeling resistance test, sample 1 is a conventional connection terminal in which the surfaces 2s and 7s are mutually parallel (i.e. ΔH=0). Samples 2 to 5 are the connection terminals according to the present exemplary embodiment, and have distance difference ΔH=2 μm, 5 μm, 30 μm and 50 μm, respectively.

[Test]

Each connection terminal T1 was engaged with and removed from the connector terminal C0 repeatedly 100 times. Thereafter, for each, an adhesion condition between the lead terminal layers 2 and insulating substrate 1 was observed by a microscope to determine whether the peel-off of the lead terminal layers 2 was occurred, or not. In FIG. 6, "X" means that the peel-off occurred, and "O" means it did not occur.

As shown in FIG. 6, the peel-off of the lead terminal layers 2 was found in sample 1, alternatively, it was not found in samples 2 to 5 in which the distance difference ΔH is 2 μm or more. Here, in sample 5, the distance difference ΔH is 50 μm and this value is the maximum thickness of the adhesive layer 8 for the reinforcement body 7. This means a thickness of the adhesive layer 8 in the end surface of the connection terminal T1 is zero. Nonetheless, the lead terminal layers 2 were not peeled off from the insulating substrate 1.

As understood from the above result, the lead terminal layers 2 are not peeled off when the distance difference ΔH is set to 2 μm or more. Specifically, when the adhesive layer 8 has such distance difference ΔH, the lead terminal layers 2 can withstand the aforementioned cutting processes and repetition of engagement with a connector, and the mechanical strength, the shape thereof and a good electrical connection with the connector can be maintained. Recently, printed circuit boards and connectors increasingly become thin. Therefore, insertability of the connection terminal will be improved even by a clearance increment of around 10 μm. In such circumstances, the present exemplary very applicable.

Meanwhile, it should be noted that the aforementioned wiring base material of the printed circuit board PC is not limited to the three-layered CCL. For example, a two-layered CCL can be used. The two-layered CCL has a base film (e.g. a polyimide resin film) and a copper film thereon. The copper layer is formed on the base film by a sputtering and plating method or the like.

When the lead terminal layers 2 are plated by nickel, gold or the like, electrodes (not shown) for plating may be provided outside the outline Y of the wiring base material, and lead portions (generally narrower than the lead terminal layers 2) may be patterned in advance in order to connect the electrodes with the lead terminal layers 2. When cutting the wiring base material, center portions of the lead portions may be cut along the outline Y as shown in a dash-dotted circle in FIG. 2. In this case, the lead portions 2A having the end surfaces 2a may remain as the end portions of the lead terminal layers 2.

The remained lead portions 2A have relatively weak mechanical strengths. Therefore, in conventional techniques, this becomes a significant problem in peel off of lead terminal layers. However, in the present exemplary embodiment, the inclined surfaces 2s reduce the peel-off.

Figure 2:
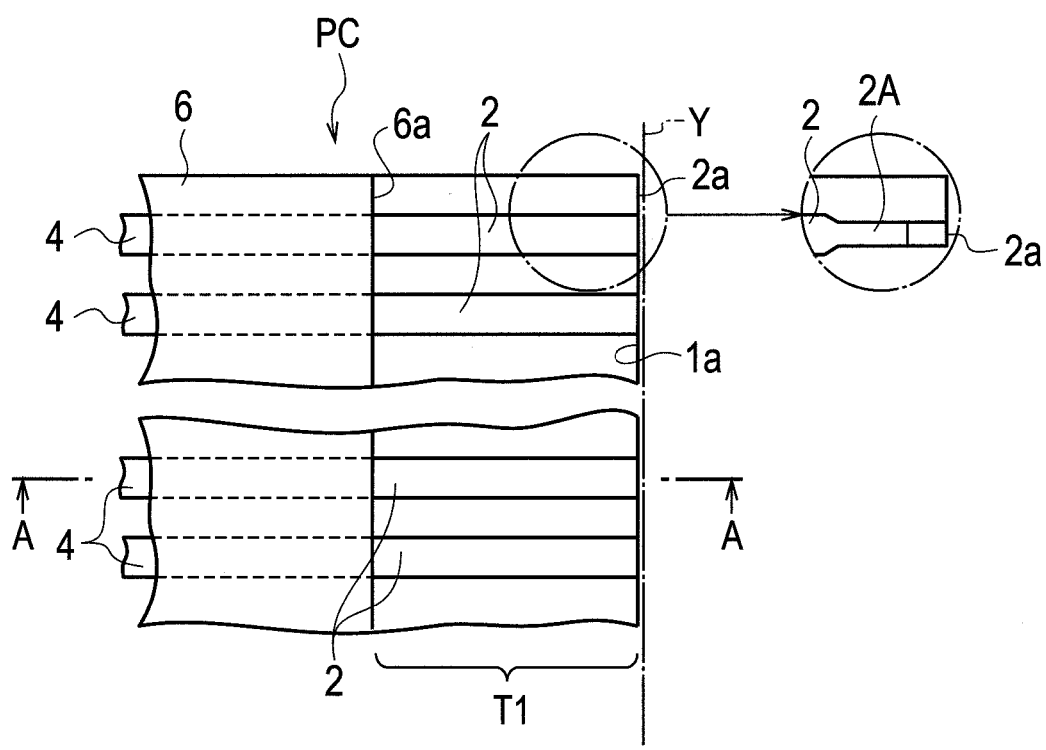
FIG. 2 is a cutaway view showing a connection terminal in a printed circuit board according to a first exemplary embodiment of the present invention.

When the lead portions are provided, in the present exemplary embodiment, they have the same widths as those of the lead terminal layers 2. Therefore, the lead portions in FIG. 2 are appeared to be included in the lead terminal layers 2, and FIG. 2 does not show the shape difference therebetween. Specifically, the widths of the lead portions according to the present exemplary embodiment are relatively large. Therefore, the mechanical strength thereof can be kept large, thereby enabling to easily cut the base wiring material into required shapes.

Second Embodiment

Figure 7A:
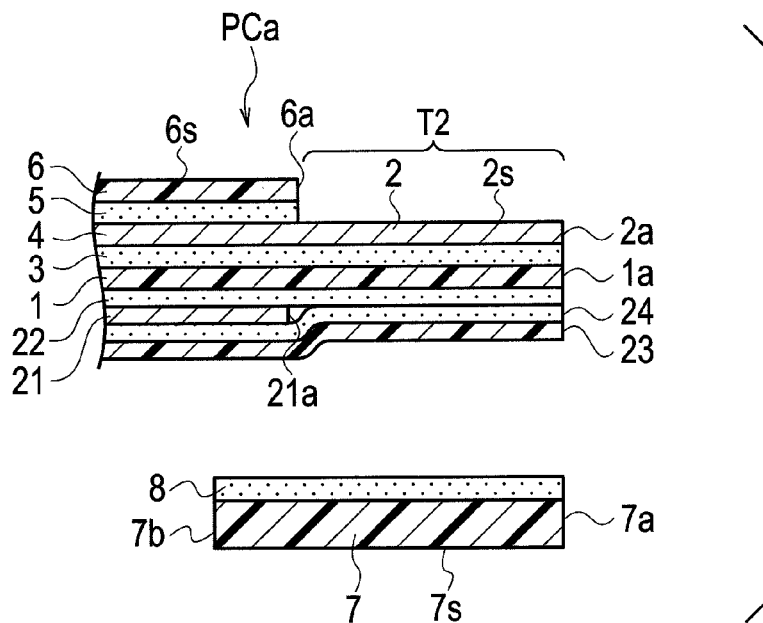
FIG. 7 is a sectional view showing a connection terminal of a printed circuit according a second exemplary embodiment of the present invention.
Figure 7B:
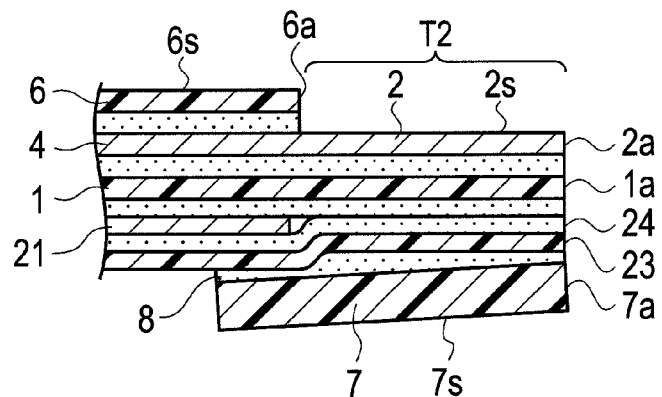
Figure 7C:
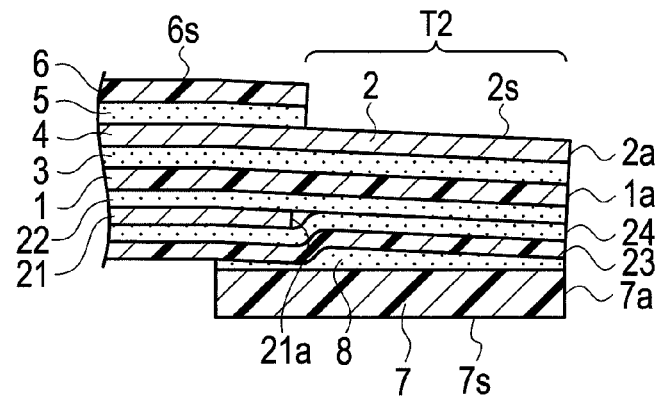

Next, a printed circuit board according to a second exemplary embodiment of the present invention will be explained with reference to FIG. 7A to 7C. FIG. 7A to 7C show manufacturing processes of the printed circuit board in order.

As shown in FIG. 7A, the printed circuit board PCa according to the present exemplary embodiment has a main body in which circuit layers are provided on both sides thereof. The printed circuit board PCa uses a double-sided Copper-Clad Laminate (double-sided CCL) in which copper films on both side are patterned.

In the present exemplary embodiment, a first circuit layer (not shown) on an upper surface (first surface) of an insulating layer 1, lead terminal layers 2, adhesive layers 3 and 5, lead wiring layers 4 and a first insulating protection film 6 are the same or similar parts as those indicated by the same reference numerals in the first exemplary embodiment.

On a lower surface (second surface), a second circuit layer 21 is adhered by an adhesive layer 22. Here, the second circuit layer 21 is, for example, a shield layer connecting to the ground potential (GND). A part of the second circuit layer 21 is formed so as to avoid the backside positions of the lead terminal layers 2 of the connection terminal T2. It should be noted that FIGS. 7A to 7C show that an edge 21a of the second circuit layer 21 is farther from the outline Y than an edge 6a of the first insulating protection film 6, however, these figures do not mean to prohibit the second circuit layer 21 from overlapping at least a part of the lead terminal layers 2.

The second circuit layer 21 is covered with a second insulating protection film 23 by an adhesive 24. Specifically, the second insulating protection film 23 is a coverlay, and is made of a polyimide film. A part of the second insulating protection film 23 is adhered on the lower surface (second surface) of the insulating substrate 1 at the backside positions of the lead terminal layers 2. The part of the second insulating protection film 23 has an end surface along the outline Y (see FIG. 2).

As described above, the second circuit layer 21 has the edge 21a extending along the lower surface (second surface) of the insulating substrate 1. The edge 21a extends along the outline Y and is space apart from the outline Y toward the lead wiring layers 4 side. Therefore, the second circuit layer 21 forms a step on the lower surface (second surface) of the insulating substrate 1 by its thickness.

The reinforcement body 7 facing to the connection terminal T2 has a rectangular and plate-like shape with a length at least from the end surface 1a of the insulating substrate 1 to the edge 21a of the second circuit layer 21. The reinforcement body 7 is prepared with an adhesive layer 8 adhered on an upper surface thereof. The reinforcement body 7 is made of a polyimide resin film, glass epoxy resin film or the like. The adhesive layer 8 is made of epoxide-base thermosetting resin adhesive.

As shown in FIGS. 7A and 7B, the reinforcement body 7 is adhered on the lower surface (second surface) of the insulating substrate 1 at the back position of the lead terminal layers 2 by the following steps. Firstly, the reinforcement body 7 is set at the backside position of the lead wiring layers 2 with placing the end surface 7a of the reinforcement body 7 along the outline Y. The adhesive layer 8 faces to the second insulating protection film 23. Secondly, the reinforcement body 7 is adhered on the lower surface (second surface) of the insulating substrate 1 by hot-pressing the surfaces 2s of the lead terminal layers 2 and the outer surface 7s of the reinforcement body 7 toward each other.

In this hot-press, the surface 7s of the reinforcement body 7 is spontaneously inclined due to the step formed by the edge 21a of the second circuit layer 21 and the insulating substrate 1. Accordingly, a distance relationship H1>H2 can be easily obtained, and it is possible to simply and easily manufacture the printed circuit boards having a distance relationship H1>D1>H2.

FIG. 7C shows the similar process as that of FIG. 5C. Specifically, the printed circuit board PCa may be bent or curved so that an outer flat surface 6s of the insulating protection film 6 become parallel to the surface 7s of the reinforcement body 7.

The printed circuit board PCa according to the second exemplary embodiment can increase functions of the circuit over those in the first exemplary embodiment. Further, as with the first exemplary embodiment, it can be manufactured easily and simply, and can prevent the lead terminal layers from being peeled off.

Third Embodiment

A printed circuit board according to a third exemplary embodiment of the present invention will be explained with reference to FIG. 8. In this exemplary embodiment, the tip-end portions of the connection terminals T1 and T2 in the first and second exemplary embodiments are modified, and the other parts except for the tip-end portions are the same as those of the first or second exemplary embodiment.

In the third exemplary embodiment, the connection terminal T1(T2) has inclined surfaces 2b at a corner defined by extensions of the surfaces 2s and end surfaces 2a of the lead terminal layers 2. The surfaces 2b are inclined toward the insulating substrate 1, and obliquely intersect the surfaces 2s and end surfaces 2a of the lead terminal layers 2. Specifically, when an intersection position O is a position at which the extensions of the surfaces 2s intersect the extensions of the end surface 2a, one end portion of the inclined surfaces 2b intersects the surfaces 2s at a position horizontally distant from the intersection position O by a distance Q, and the other end portion of the surfaces 2b intersect the end surfaces 2a at a position vertically distant from the intersection position O by a distance P. In FIG. 8, each inclined surfaces 2b has a flat surface. However, it may have a concave or convex curved surface. For example, the curved surface may have a circular or ellipsoidal outline in the cross section thereof.

In the third exemplary embodiment, the distance H2 defined in the tip-end of the connection terminal T1(T2) (see FIG. 3) become further smaller than that in the first and second exemplary embodiment. Therefore, it is possible to further securely prevent the end surfaces 2a from butting into the tip-end of the contact portions C2 and also prevent the lead terminal layers 2 from being peeled off.

Figure 8:
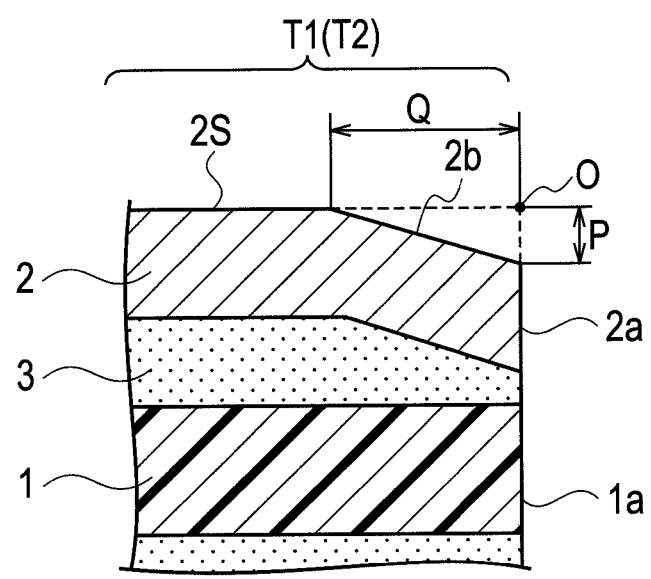
FIG. 8 is a magnified sectional view showing a part of a connection terminal of a printed circuit board according to a third exemplary embodiment of the present invention.

Regarding the distances Q and P, FIG. 8 shows the distance Q larger than the distance P. The distance Q may be equal to or smaller than the distance P. However, when the distance Q is larger than the distance P, since the inclined surfaces 2b are mildly inclined this enables the contact portions C2 to more smoothly slide on the inclined surfaces 2b to prevent the lead terminal layers 2 from being peeled off.

It should be noted that the present invention is not limited to the printed circuit boards in the above first to third exemplary embodiments. Specifically, the present invention can be applied to a multilayer printed circuit board in which its main body is formed by stacking a plurality of wiring base materials, and can be also applied to a flexible flat cable (FFC) which does not have a circuit layer to mutually connect electronic parts mounted thereon. In addition, the present invention can be applied to not only the flexible printed circuit (FPC) but also a rigid printed circuit (RPC) and a hybrid circuit board with the FRC and RPC that have a connection terminal for connection of a connector.

What is claimed is:

1. A printed circuit board having a connection terminal with an outline configured to be inserted into an external connector, the connection terminal comprising:
    an insulating substrate provided with a first surface and a second surface opposite to the first surface, the insulating substrate including an end surface along the outline normal to an insertion direction of the connection terminal to the external connector;
    at least one lead wiring layer formed on the first surface of the insulating substrate;
    an insulating protection film covering the lead wiring layer;
    at least one lead terminal layer constituting an end portion of the lead wiring layer, the lead terminal layer being formed into a strip, and having an exposed outer surface and an end surface along the outline;
    a reinforcement body adhered on the second surface of the insulating substrate at a backside position of the lead terminal layer, the reinforcement body having an outer surface; and
    an adhesive layer adhering the reinforcement body to the insulating substrate,
    wherein a first distance between the outer surface of the lead terminal layer and the outer surface of the reinforcement body on the outline side is smaller than a second distance between the outer surface of the lead terminal layer and the outer surface of the reinforcement body on the lead wiring layer side,
    wherein a thickness of the adhesive layer on the outline side is smaller than a thickness of the adhesive layer on the lead wiring layer side, and
    wherein the difference in adhesive layer thickness defines a relationship that the first distance is smaller than the second distance.

2. The printed circuit board according to claim 1, wherein the at least one lead wiring layer and at least one lead terminal layer include a plurality of lead wiring layers and a plurality of lead terminal layers, respectively, and the lead terminal layers are arranged parallel with each other.

3. The printed circuit board according to claim 1, further comprising:
    a first circuit layer provided on the first surface of the insulating substrate, the first circuit layer electrically connecting with the lead terminal layer through the lead wiring layer; and
    a second circuit layer provided on the second surface of the insulating substrate, the second circuit layer being formed so as to avoid the backside position of the lead terminal layer.

4. The printed circuit board according to claim 3, wherein the second circuit layer has an edge parallel to the outline and spaced apart from the outline toward the lead wiring layer side and forming a step on the second surface of the insulating substrate which defines a relationship that the first distance is smaller than the second distance.

5. The printed circuit board according to claim 1, wherein a difference of the second distance from the first distance is 2 μm or more.

6. The printed circuit board according to claim 1, wherein the lead terminal layer has an inclined surface at an end portion thereof, the inclined surface being inclined toward the insulating substrate.

7. The printed circuit board according to claim 1, wherein the adhesive layer is made of thermosetting resin adhesive.

8. A method for manufacturing a printed circuit board having a connection terminal being configured to be inserted into an external connector, the connection terminal having an outline normal to an insertion direction of the connection terminal, the method comprising:
    (a) forming at least one lead terminal layer into a strip on a first surface of an insulating substrate, the at least one lead terminal having an end surface along the outline and an upper outer surface exposed to the outside; and the insulating substrate having an end surface along the outline;
    (b) adhering a first adhesive layer and a second adhesive layer being thicker than the first adhesive layer on a first surface of a reinforcement body, the first adhesive layer being disposed on the outline side, and the second adhesive layer being disposed on an opposite side to the outline side;
    (c) facing the first and second adhesive layers to a second surface of the insulating substrate at a backside position of the lead terminal layer, the second surface being opposite to the first surface of the insulating substrate; and
    (d) hot-pressing the first surface of the lead terminal layer and a second surface opposite to the first surface of the reinforcement body toward each other to adhere on a second surface of the insulating substrate being opposite to the first surface thereof.

9. A printed circuit board having a connection terminal configured to be inserted into an external connector, the connection terminal comprising:
    an insulating substrate having a first surface and a second surface opposite to the first surface, the insulating substrate including an end surface at an insertion end of the connection terminal normal to an insertion direction of the connection terminal into the external connector;
    at least one lead wiring layer formed on the first surface of the insulating substrate;
    an insulating protection film covering the lead wiring layer;
    at least one lead terminal layer formed on the first surface of the insulating substrate at an end portion of the lead wiring layer, the lead terminal layer comprising an exposed surface of the lead wiring layer having no insulating protection film and extending from a point where the insulating protection film ends to the insertion end of the connection terminal, and having an exposed end surface at the insertion end of the connection terminal;
    a reinforcement body having a top surface adhered on the second surface of the insulating substrate opposite the lead terminal layer, and a bottom surface; and
    an adhesive layer which adheres the reinforcement body to the insulating substrate,
    wherein a first distance between the exposed surface of the lead terminal layer and the bottom surface of the reinforcement body at the insertion end of the connection terminal is smaller than a second distance between the exposed surface of the lead terminal layer at the point where the insulating protection film ends and the bottom surface of the reinforcement body opposite that point, wherein a thickness of the adhesive layer at the insertion end of the connection terminal is smaller than a thickness of the adhesive layer at an end of the reinforcement body opposite the insertion end of the connection terminal, wherein the difference in adhesive layer thickness establishes a relationship that the first distance is smaller than the second distance.

10. The printed circuit board according to claim 9, wherein a difference of the second distance from the first distance is greater than or equal to 2 μm.

11. The printed circuit board according to claim 9, wherein a difference of the second distance from the first distance is in a range of 2-50 μm.

12. A printed circuit board having a connection terminal with an outline configured to be inserted into an external connector, the connection terminal comprising:

an insulating substrate provided with a first surface and a second surface opposite to the first surface, the insulating substrate including an end surface along the outline normal to an insertion direction of the connection terminal to the external connector;

at least one lead wiring layer formed on the first surface of the insulating substrate; an insulating protection film covering the lead wiring layer;

at least one lead terminal layer constituting an end portion of the lead wiring layer, the lead terminal layer being formed into a strip, and having an exposed outer surface and an end surface along the outline;

a reinforcement body adhered on the second surface of the insulating substrate at a backside position of the lead terminal layer, the reinforcement body having an outer surface;

a first circuit layer provided on the first surface of the insulating substrate, the first circuit layer electrically connecting with the lead terminal layer through the lead wiring layer; and a second circuit layer provided on the second surface of the insulating substrate, the second circuit layer being formed so as to avoid the backside position of the lead terminal layer, wherein a first distance between the outer surface of the lead terminal layer and the outer surface of the reinforcement body on the outline side is smaller than a second distance between the outer surface of the lead terminal layer and the outer surface of the reinforcement body on the lead wiring layer side.

13. The printed circuit board according to claim 12, wherein the second circuit layer has an edge parallel to the outline and spaced apart from the outline toward the lead wiring layer side and forming a step on the second surface of the insulating substrate which defines a relationship that the first distance is smaller than the second distance.

14. The printed circuit board according to claim 12, wherein a difference of the second distance from the first distance is 2 μm or more.

15. The printed circuit board according to claim 12, wherein the lead terminal layer has an inclined surface at an end portion thereof, the inclined surface being inclined toward the insulating substrate.

* * * * *